United States Patent [19]
Chyun et al.

[11] Patent Number: 5,791,709
[45] Date of Patent: Aug. 11, 1998

[54] SEMICONDUCTOR MANUFACTURING APPARATUS HAVING SUCTORIAL MEANS FOR HANDLING WAFERS

[75] Inventors: Ki-hyun Chyun; Yong-su Kim, both of Yongin, Rep. of Korea

[73] Assignee: Samsung Electronics Co., Ltd., Suwon, Rep. of Korea

[21] Appl. No.: 713,037

[22] Filed: Sep. 12, 1996

[30] Foreign Application Priority Data

Sep. 13, 1995 [KR] Rep. of Korea ............... 1995-29834

[51] Int. Cl.⁶ .......................................... B25J 15/06
[52] U.S. Cl. ................................ 294/64.1; 414/941
[58] Field of Search ..................... 294/1.2, 64.1–65; 414/935, 936, 939, 941; 29/743, 758; 901/40

[56] References Cited

U.S. PATENT DOCUMENTS

| | | | |
|---|---|---|---|
| 3,720,433 | 3/1973 | Rosfelder | 294/65 |
| 4,428,815 | 1/1984 | Powell et al. | 294/64.1 |
| 4,528,746 | 7/1985 | Yoshimura | 29/743 |
| 4,557,514 | 12/1985 | Cushman et al. | 294/64.1 |
| 4,767,142 | 8/1988 | Takahashi et al. | 294/64.1 |
| 4,773,687 | 9/1988 | Bush et al. | 294/64.1 |
| 4,843,711 | 7/1989 | Rager | 294/64.1 |
| 5,207,467 | 5/1993 | Smith | 294/64.1 |

*Primary Examiner*—Dean Kramer
*Attorney, Agent, or Firm*—Jones & Volentine, L.L.P.

[57] ABSTRACT

A semiconductor manufacturing apparatus using a suctorial device for handling wafers includes a main vacuum line, a manufacturing apparatus for performing predetermined manufacturing processes with respect to the wafers, and a vacuum line for connecting the main vacuum line to the suctorial device. The vacuum line has a first vacuum line directly connected to the main vacuum line, and a second vacuum line having one end connected to the first vacuum line, the other end connected to the suctorial device through a connector installed in the manufacturing apparatus and a body installed in the manufacturing apparatus. The manufacturing apparatus may also contain a plurality of suctorial devices with a corresponding plurality of second vacuum lines and connectors.

11 Claims, 2 Drawing Sheets

SEMICONDUCTOR MANUFACTURING APPARATUS HAVING SUCTORIAL MEANS FOR HANDLING WAFERS

BACKGROUND OF THE INVENTION

The present invention relates to a semiconductor manufacturing apparatus, and more particularly, to a manufacturing apparatus of semiconductor devices having suctorial means for handling wafers.

As semiconductor devices achieve higher component integration and provide more complex functions, the manufacturing apparatus for such complex devices plays an important role. Indeed, the manufacturing apparatus itself must also improve to keep pace with present and future technological advances in the underlying devices.

Many instruments are used in handling wafers during semiconductor processing, one of which is vacuum tweezers, which are described below.

Very early versions of tweezers were generally in the form of simple tongs. Such tong-type tweezers not only made wafer handling difficult, but also the tongs were not sufficiently strong to hold larger wafers. In addition, since many wafers were scratched by the tong-type tweezers, they are rarely used at present day laboratories and manufacturing facilities. Accordingly, vacuum tweezers using a vacuum as a wafer suctorial or suction means are generally used in a manufacturing line.

FIG. 1 is a schematic view showing a conventional semiconductor manufacturing apparatus having vacuum tweezers. Reference numeral 100 denotes a main vacuum line which is fundamentally installed in a factory. Reference numeral 50A denotes a first vacuum line where vacuum from the main vacuum line 100 is supplied to a second vacuum line 50B. Vacuum line 50B functions to connect the main vacuum line 100 to vacuum tweezers 60. Reference numeral 52 denotes a valve for controlling the vacuum of the first vacuum line 50A. Reference numeral 400 denotes a wafer processing unit for performing predetermined manufacturing processes with respect to wafers, and reference numeral 300 denotes partitions for sectioning wafer processing unit 400 from main vacuum line 100 and the first vacuum line 50A, respectively.

In operation, the first vacuum line 50A is connected to the second vacuum lines 50B via a "T" connector 54 and supplies vacuum to the vacuum tweezers 60. Specifically, valve 52 is opened, supplying vacuum to vacuum tweezers 60. Vacuum holes 62 installed at the end of vacuum tweezers 60 come in contact with the wafer (not shown), so as to adhere to the wafer. The wafer may then be handled during the manufacturing process.

The vacuum tweezers 60 are installed in order to manually handle wafers during the semiconductor manufacturing process, and are used to, for example, check completed wafers, clean wafers, observe samples formed on wafers, or move wafers from one carrier to another carrier.

Referring to FIG. 1, the second vacuum lines 50B connected to the vacuum tweezers 60 are not fixed when installed to the first vacuum line 50A, thereby allowing free movement of the second vacuum lines 50B whenever vacuum tweezers 60 are used. However, with such movement static electricity is generated on the second vacuum lines 50B by contact with other adjacent vacuum lines, and dust floats upward due to the static electricity, thereby resulting in wafer contamination.

Another drawback of the conventional handling apparatus is that when the wafers are handled using the vacuum tweezers 60, the second vacuum lines 50B may become twisted with each other or may be stepped on by users of the machines. When the lines are twisted or stepped on, the vacuum cannot be supplied through the second vacuum lines 50B. This results in the wafer falling away from the vacuum tweezers 60 and breaking or scratching the surface thereof.

SUMMARY OF THE INVENTION

Accordingly, it is an object of the present invention to provide a semiconductor manufacturing apparatus having suctorial means which prevents dust contaminated, broken, or scratched wafers caused by a loss of vacuum pressure.

To accomplish the above object, there is provided a semiconductor manufacturing apparatus for performing predetermined processes on wafers, having a main vacuum line and a suctorial means for handling the wafers, the apparatus comprising: a vacuum line for connecting the main vacuum line to the suctorial means, wherein the vacuum line comprises a first vacuum line directly connected to the main vacuum line; and a second vacuum line having one end connected to the first vacuum line and another end connected to the suctorial means through a connector installed in the wafer processing unit.

It is preferable that when a plurality of suctorial means are installed, the number of second vacuum lines and the number of connectors correspond to the number of the suctorial means, with the position being determined by manufacturing processes performed in the wafer processing unit. It is further preferable that the suctorial means is vacuum tweezers.

According to the present invention, characteristics of the semiconductor device can be enhanced and high process yields can be obtained since the number of wafers that are broken or scratched is minimized.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
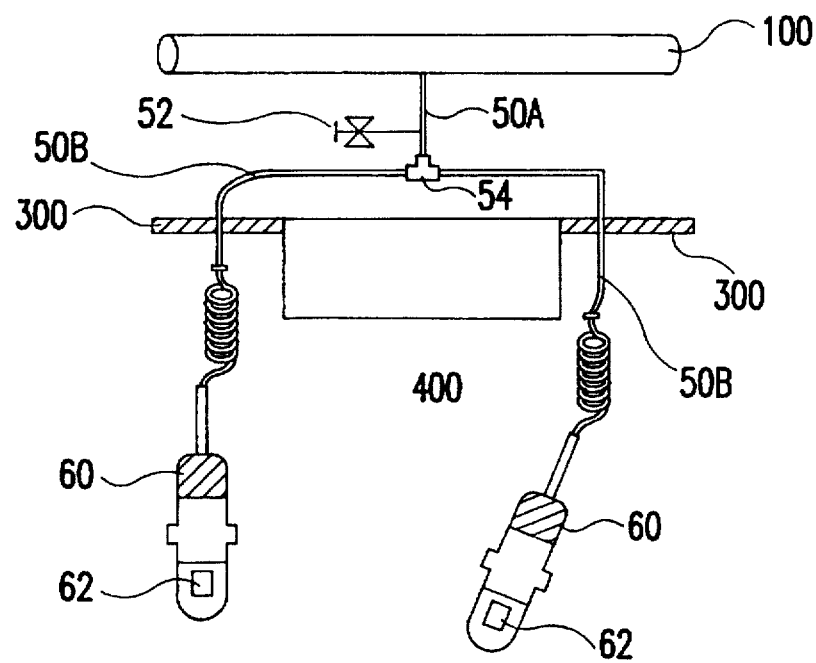
FIG. 1 is a schematic view showing a conventional semiconductor manufacturing apparatus having vacuum tweezers.
Figure 2:
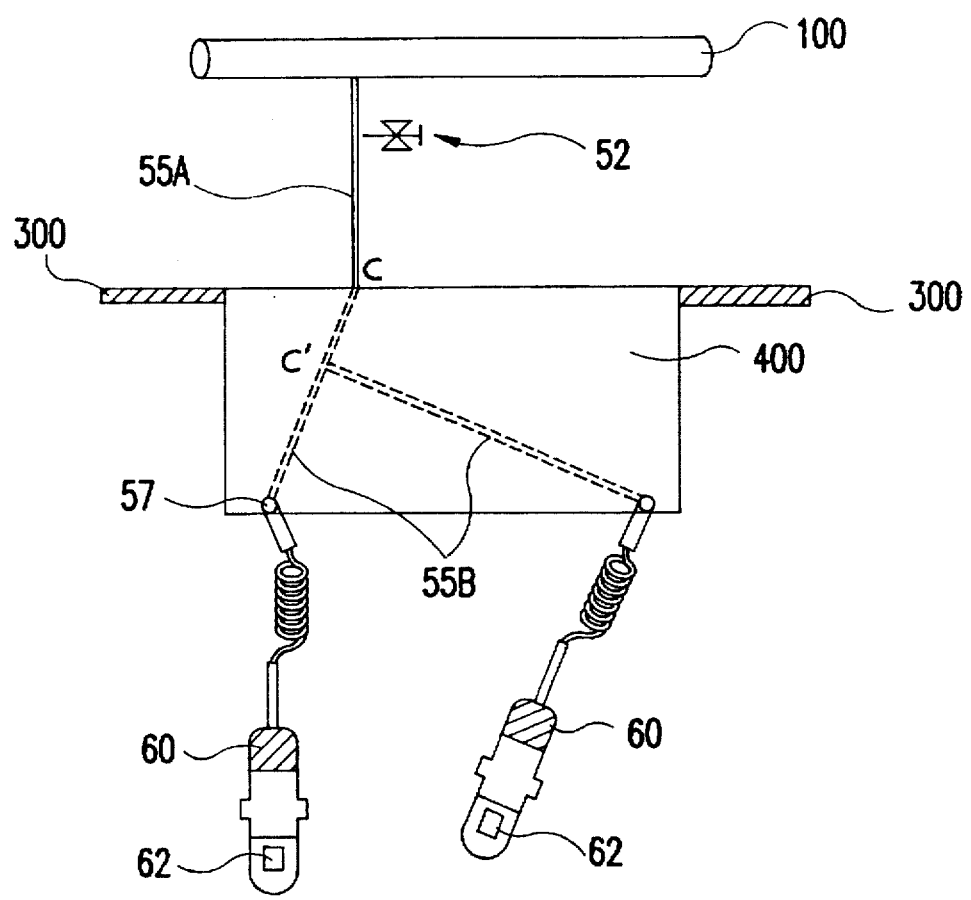
FIG. 2 is a schematic view showing a semiconductor manufacturing apparatus having vacuum tweezers according to the present invention.

Referring to FIG. 2, reference numeral 100 denotes a main vacuum line, reference numeral 55A denotes a first vacuum line directly connected to the main vacuum line 100, reference numeral 52 denotes a valve for controlling the vacuum supplied from the main vacuum line 100 to the first vacuum line 55A, reference numeral 400 denotes a wafer processing unit for performing predetermined processes with respect to wafers, reference numeral 300 denotes partitions for sectioning the wafer processing unit 400 from the main vacuum line 100, reference numeral 55B denotes a second vacuum line installed in the wafer processing unit 400 and connected to the first vacuum line 55A, reference numeral 57 denotes a connector for connecting the second vacuum line 55B to vacuum tweezers 60 as wafer suctorial means, respectively.

The vacuum lines for supplying vacuum of the main vacuum line 100 to the vacuum tweezers 60 are largely divided into the first vacuum line 55A directly connected to the main vacuum line 100 and the second vacuum line 55B having one end connected to the first vacuum line 55A at point C in FIG. 2, the other end connected to the vacuum tweezers 60 via a connector 57 installed in the wafer processing unit 400.

When a plurality of vacuum tweezers are installed, the number of second vacuum lines 55B and of the number of connectors 57 correspond to the number of the vacuum tweezers 60. The position of the connectors 57 is variable and is determined by a manufacturing process performed in the wafer processing unit 400. According to the present embodiment as illustrated in FIG. 2, respective connectors 57 are placed at either side of the wafer processing unit 400.

The additional plurality of second vacuum lines 55B may be connected at a common point C in FIG. 2, or they may branch off other of the second vacuum lines 55B as shown by point C' in FIG. 2.

Also, the size of the connector 57 changes as the size of the wafer to be handled changes. In general, as the wafer size increases, the required vacuum for providing suction to the wafer should be stronger. Accordingly, the size of the connector 57 also increases.

At one end of the vacuum tweezers 60, a vacuum hole 62 for providing suction to the wafer is formed. At the other end there is provided a connecting portion (not shown) connected to the connector 57 installed in wafer processing unit 400.

The method of using the vacuum tweezers will now be described as follows. When a user opens the valve 52, the vacuum supplied to the first vacuum line 55A is supplied to the connector 57 through the second vacuum line 55B installed in the wafer processing unit 400. When the user connects the vacuum tweezers 60 to the connector 57, the vacuum is supplied to a vacuum hole 62 of the vacuum tweezers 60. When the vacuum hole 62 of the vacuum tweezers 60 contacts the surface of the wafer, the wafer adheres to the vacuum tweezers 60.

In the embodiment using more than one vacuum tweezers 60, since the second vacuum lines 55B connected to the vacuum tweezers 60 are directly connected and fixed to the wafer processing unit 400, wafer contamination due to the dust caused by static electricity can be reduced, and the wafer breakage and scratches due to vacuum interruption caused by twisting or stepping on the vacuum lines can be minimized. Accordingly, the productivity characteristics of the device can be enhanced and the high yield can be obtained.

Note that the connectors 57 are installed in the wafer processing unit 400 in predetermined locations. Therefore whenever certain of the vacuum tweezers 60 are not required to be used, the vacuum tweezers can be eliminated, preventing damage due to vacuum leaks. Moreover, in the present invention the range of motion of the vacuum tweezers 60 can be controlled to a greater extent, preventing collision accidents during a processing operation.

It should be understood that the invention is not limited to the illustrated embodiment and that many changes and modifications can be made within the scope of the invention by a skilled person in the art.

What is claimed is:

1. A semiconductor manufacturing apparatus having suctorial means for handling wafers, comprising:

a wafer processing unit for performing predetermined processes on said wafers;

a vacuum line for connecting a main vacuum line to said suctorial means, wherein said vacuum line comprises a first vacuum line directly connected to said main vacuum line; and a second vacuum line installed in said wafer processing unit and having one end connected to said first vacuum line and another end connected to said suctorial means through a connector installed in said wafer processing unit.

2. A semiconductor manufacturing apparatus according to claim 1, further comprising:

a plurality of suctorial means for handling the wafers;

a plurality of corresponding second vacuum lines; and a plurality of corresponding connectors for connecting respective second vacuum lines to said plurality of suctorial means.

3. A semiconductor manufacturing apparatus according to claim 2, wherein said connectors being in variable positions determined by manufacturing processes performed in said wafer processing unit.

4. A semiconductor manufacturing apparatus according to claim 2, wherein one of said plurality of second vacuum lines is directly connected to said main vacuum line and another of said plurality of second vacuum lines is connected to the main vacuum line via said one of said plurality of second vacuum lines.

5. A semiconductor manufacturing apparatus according to claim 1, wherein said suctorial means is a vacuum tweezers.

6. A manufacturing apparatus for handling semiconductor wafers, comprising:

a first vacuum line connected to a vacuum pressure source; and a plurality of second vacuum lines;

a first one of said plurality of second vacuum lines having a first length terminated at one end by a connection to said first vacuum line, and terminated at another end by a connection to a first connector;

a second one of said plurality of second vacuum lines having a second length terminated at one end by a connection to a point along said first one of said plurality of second vacuum lines, and terminated at another end by a connection to a second connector; and a plurality of suctorial means respectively connected to said first and second connectors.

7. The manufacturing apparatus of claim 6, wherein said first and second connectors are selectively replaceable with the apparatus to accommodate variously sized semiconductor wafers.

8. The manufacturing apparatus of claim 6, wherein said plurality of suctorial means comprises at least one set of vacuum tweezers.

9. A manufacturing apparatus for performing at least one manufacturing process on a semiconductor wafer, said manufacturing apparatus receiving a first vacuum line connecting the manufacturing apparatus to a vacuum pressure source, and comprising:

a plurality of second vacuum lines integral to said manufacturing apparatus;

a first one of said plurality of second vacuum lines having a first length terminated at one end by a connection to said first vacuum line, and terminated at another end by a connection to a first connector at a first point in said manufacturing apparatus;

a second one of said plurality of second vacuum lines having a second length terminated at one end by a connection to a point along said first one of said plurality of second vacuum lines, and terminated at another end by a connection to a second connector at a second point in said manufacturing apparatus; and a plurality of suctorial means respectively distending from the manufacturing apparatus at said first and second connectors.

10. The manufacturing apparatus of claim 9, wherein said first and second connectors are selectively replaceable with variously sized connectors to accommodate variously sized semiconductor wafers.

11. The manufacturing apparatus of claim 9, wherein said plurality of suctorial means comprises at least one set of vacuum tweezers.

* * * * *